United States Patent
Desplats

(10) Patent No.: US 7,692,151 B2
(45) Date of Patent: Apr. 6, 2010

(54) DEVICE FOR ANALYZING AN INTEGRATED CIRCUIT

(75) Inventor: Romain Desplats, Castanet Tolosan (FR)

(73) Assignee: Centre National d'Etudes Spatiales, Paris (FR)

(*) Notice: Subject to any disclaimer, the term of this patent is extended or adjusted under 35 U.S.C. 154(b) by 0 days.

(21) Appl. No.: 12/088,432

(22) PCT Filed: Oct. 2, 2006

(86) PCT No.: PCT/FR2006/002220

§ 371 (c)(1),
(2), (4) Date: Apr. 1, 2008

(87) PCT Pub. No.: WO2007/036649

PCT Pub. Date: Apr. 5, 2007

(65) Prior Publication Data

US 2008/0218750 A1    Sep. 11, 2008

(30) Foreign Application Priority Data

Sep. 30, 2005 (FR) .................................. 05 10038

(51) Int. Cl.
*G01J 5/02* (2006.01)
(52) U.S. Cl. .................................... 250/341.8; 324/501

(58) Field of Classification Search ................. 250/330, 250/341.8; 324/501
See application file for complete search history.

(56) References Cited

U.S. PATENT DOCUMENTS

| 5,940,545 | A | 8/1999 | Kash et al. |
| 6,388,454 | B1 | 5/2002 | Akikuni et al. |
| 6,716,683 | B1* | 4/2004 | Bruce et al. .................. 438/151 |
| 6,828,809 | B1* | 12/2004 | Bruce et al. .................. 324/752 |
| 6,859,031 | B2 | 2/2005 | Pakdaman et al. |
| 2003/0098692 | A1 | 5/2003 | Cotton et al. |
| 2003/0146761 | A1* | 8/2003 | Pakdaman et al. .......... 324/501 |
| 2004/0103353 | A1 | 5/2004 | Koyama et al. |
| 2005/0030051 | A1 | 2/2005 | Hanson et al. |

* cited by examiner

*Primary Examiner*—David P Porta
*Assistant Examiner*—Mark R Gaworecki
(74) *Attorney, Agent, or Firm*—Young & Thompson

(57) ABSTRACT

A device (10) for analyzing a circuit (14) includes at least one element (22) for observing light emitted by at least one localized observation zone of the circuit resulting from the electric current flowing in the zone; elements (26) for exciting the circuit. The circuit exciting elements include a laser source (26) and elements (30) for applying a laser beam generated by the source on the observation zone (22). The device includes members (M1, M2) for protecting the observation zone (22) against the incident and reflected laser beams.

9 Claims, 3 Drawing Sheets

DEVICE FOR ANALYZING AN INTEGRATED CIRCUIT

The present invention relates to a device for analyzing an integrated circuit, of a type including:
  at least one means of observation of the light emitted by at least one localised observation area on the circuit due to the flow of electric current in this area,
  means for exciting the circuit.

Several observation methods can be implemented to obtain information characteristic of the state of an integrated circuit.

In particular, the document U.S. Pat. No. 6,859,031 describes three possible observation methods, which can be implemented alternately on the same circuit.

A first method consists in producing a two-dimensional image of the circuit that is emitting light. To this end, the circuit is placed in darkness. A test sequence is applied to the terminals of the circuit in order to excite it. The electric current flowing in the circuit produces light emitted by the circuit at different points at which electrical phenomena have taken place. An optical sensor such as a matrix of charge-coupled detectors acquires the light emitted by the circuit when it is operating.

A microscope lens is placed between the integrated circuit and the optical sensor. The optical sensor is placed in the image plane of the microscope.

According to another method, a photodiode is placed facing a small observation area of the circuit. This photodiode detects light emission peaks at instants when the transistors present in this observation area are activated when a test sequence is being applied. Thus, for the area in question, the method provides for determining the change over time in light emissions. The result obtained is a graph having peaks at the emission instants. Such a method is referred to as "time-resolved emission". This method is described in the US patent of IBM, U.S. Pat. No. 5,940,545, using the PICA (Picosecond Imaging Circuit Analysis) technique for a single PICA point or single-point PICA analysis.

According to a third method commonly referred to as observation by reflected laser, a laser beam is focused onto a point on the circuit. A detection diode determines the light intensity of the wave reflected at the point on which the laser beam is focused. The laser beam scans the surface of the circuit in order to enable acquisition of a matrix of values from the detection diode, each value corresponding to a position of the laser beam on this circuit. From this matrix of values, an image of the circuit is constructed.

The PHEMOS-1000 microscope, marketed by the company Hamamatsu, proposes means for alternate implementations, on an integrated circuit, of observation means by a light emission method or by a reflected laser method.

Switching between one observation mode and another is achieved by the insertion of a mirror enabling the light from the circuit to be diverted to one or the other of the observation means.

The analysis device described previously provides for the implementation of several observation methods but these must be implemented successively and none of the devices provides for these observation methods to be implemented simultaneously. The user therefore cannot benefit from the advantages of the various observation methods simultaneously.

An aim of the invention is to propose an analysis device enabling the simultaneous implementation of an observation by light emission and of a laser stressing the circuit observed.

To this end, a subject of the invention is an analysis device of the abovementioned type, characterized in that the means for exciting the circuit include a laser source and means for applying the laser beam generated by the source on an excitation area of the circuit at the same time as the circuit is observed by the observation means, and in that the device includes means for protecting the observation means from the incident and reflected laser beams.

Depending on the embodiments, the device includes one or more of the following features:
  the observation means and the laser beam application means include means for guiding the light emitted by the circuit and the emitted and reflected laser beams along the same optical path in proximity to the circuit;
  the observation means include a sensor matrix;
  the sensors are chosen from the group consisting of visible or infrared imaging charge-coupled devices (CCDs), gallium arsenide (InGaAs) sensors or Mercury Cadmium Telluride (MCT) sensors;
  the sensors are three-dimensional light emission sensors of the Picosecond Imaging Circuit Analysis (PICA) type;
  the observation means include a time-resolved emission single-point sensor referred to as being of the TRE (Time-Resolved Emission) type or of the single-point PICA type;
  the means for guiding the light include at least one semi-reflecting mirror arranged between the circuit and the observation means in a transmission path and between the laser source and the circuit in a reflection path, the semi-reflecting mirror being at least partly transparent to the wavelengths emitted by the circuit and reflecting for the wavelength of the laser beam emitted by the laser source;
  the means of observation of the emitted light include at least a first and a second sensor, arranged behind the a first and a second semi-reflecting mirror respectively, and successively in that order from the circuit to the laser source in the path of the reflected laser beam, the first and second semi-reflecting mirrors being at least partly transparent to the wavelengths emitted by the circuit and reflecting for the wavelength of the laser beam emitted by the laser source, the first semi-reflecting mirror being only partly transparent to the observation wavelengths of the second sensor; and
  the device includes a diode for measuring the intensity of the reflected laser beam.

The invention will be better understood on reading the following description given purely by way of example and with reference to the drawings in which.

Figure 1:
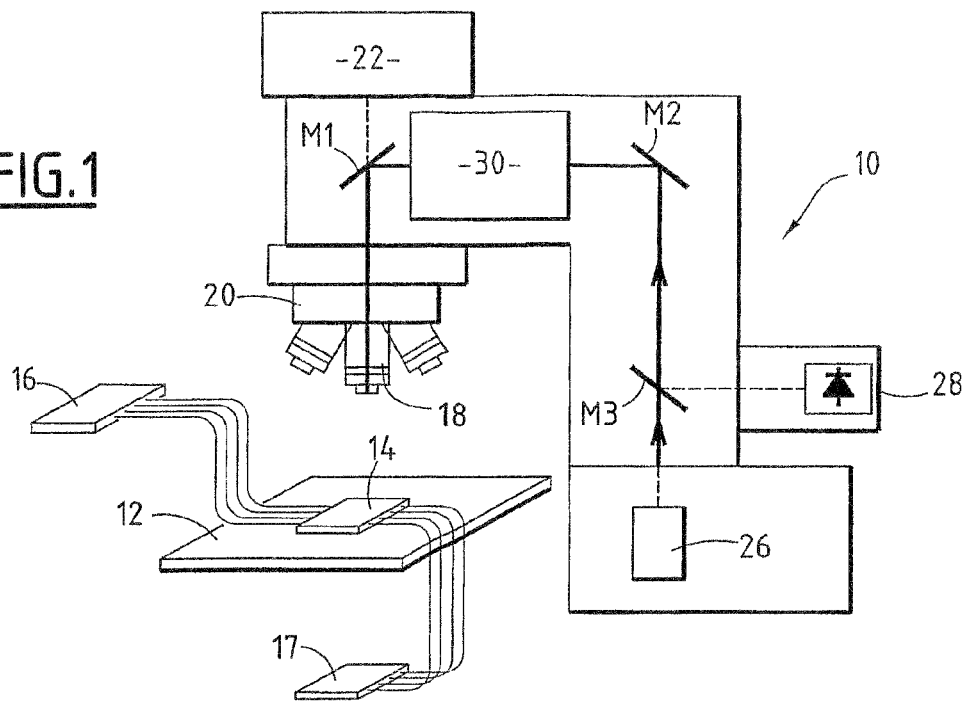
FIG. 1 is a schematic view of an analysis device according to a first embodiment of the invention.

The analysis device 10 illustrated in FIG. 1 includes a stage 12 supporting an integrated circuit 14 to be observed. The device includes a tester 16 intended to apply a test sequence to the input terminals of the integrated circuit 14 as is known per se.

Similarly, this tester 16 includes means 17 for receiving electric signals supplied at the output of the integrated circuit 14 in response to the test sequence.

At right angles to the circuit 14, the device includes one or more microscope lenses 18 mounted on a turret 20.

Opposite the circuit, in relation to the lens, the device includes a first semi-reflecting mirror M1, the reflecting face of which is turned at 45° to the circuit. Behind the mirror M1 there is arranged a light emission analysis device 22. This device is placed facing the circuit 14 in the optical axis of the lens 18.

According to a first embodiment, the light emission analysis device 22 includes, as is known per se, a charge-coupled device CCD.

As a variant, it includes an MCT (Mercury Cadmium Telluride) type sensor providing a near infrared detection.

According to another variant, the device 22 includes PICA (Picosecond Imaging Circuit Analysis) type sensor.

Facing the 45° reflecting side of the mirror M1, there is arranged a second mirror M2 that is totally reflecting, forming an angle reflection.

A third semi-reflecting mirror M3 is arranged at 45° facing the mirror M2.

A laser source 26 is arranged behind the mirror M3. This source is directed to pass through the mirror M3. The source is sufficiently powerful in order that the beam focused at a point on the circuit 14 is capable of altering the behaviour of a circuit. Depending on the wavelength, it is possible to generate a photocurrent and/or to generate local heating. These disturbances can modify the current flowing through the circuit and are therefore capable of being analyzed by a light emission observation means.

The mirrors M3, M2 and M1 are arranged such that the laser beam, after having passed through the mirror M3, is reflected successively at the mirrors M2 and M1, up to the integrated circuit 14 after having passed through the lens 18.

In the reverse sense, the arrangement of the mirrors M1, M2 and M3 successively positioned facing one another is such that the laser beam reflected at the circuit 14 is propagated successively at the mirrors M1, M2 and M3 by being reflected at these mirrors.

Advantageously, two interchangeable laser sources are used. The lasers are used, depending on the case, to produce either a photoelectric effect or a heating effect.

These sources have wavelengths greater than 800 nm and in the near infrared in order to pass through silicon.

The choice of 1064 nm, close to the band gap of silicon, encourages the creation of currents by photo-generation. Light in the form of photons is converted into carriers (electrons and holes) which are separated under the action of an electric field.

The choice of 1340 nm is a wavelength that is transparent to silicon and gives rise predominantly to heating effects. The laser ends up, for example, heating the metal tracks after having passed through the silicon.

A diode 28 for detecting the light intensity of the reflected laser wave is arranged at 45° facing the mirror M3 on the side of its reflecting face.

The mirror M3 is, for example, a polarized semi-reflecting mirror intended to reflect towards the diode 28 the reflected laser beam with a phase shift relative to the incident laser beam. Thus, the mirror M3 is such that the incident laser beam is totally transmitted, while the phase-shifted reflected laser beam is totally reflected towards the diode 28.

As is known per se, when laser beam is being reflected at the circuit 14, its phase is offset in such a way that it is reflected by a polarized plate itself offset by the same angle and forming the mirror M3.

A unit 30 for displacing the incident laser beam emitted by the source is arranged between the mirrors M2 and M1 in order to scan the integrated circuit by displacing the incident laser beam. Similarly, this unit is intended to provide identical displacement in the return direction for the reflected laser beam.

Figure 2:
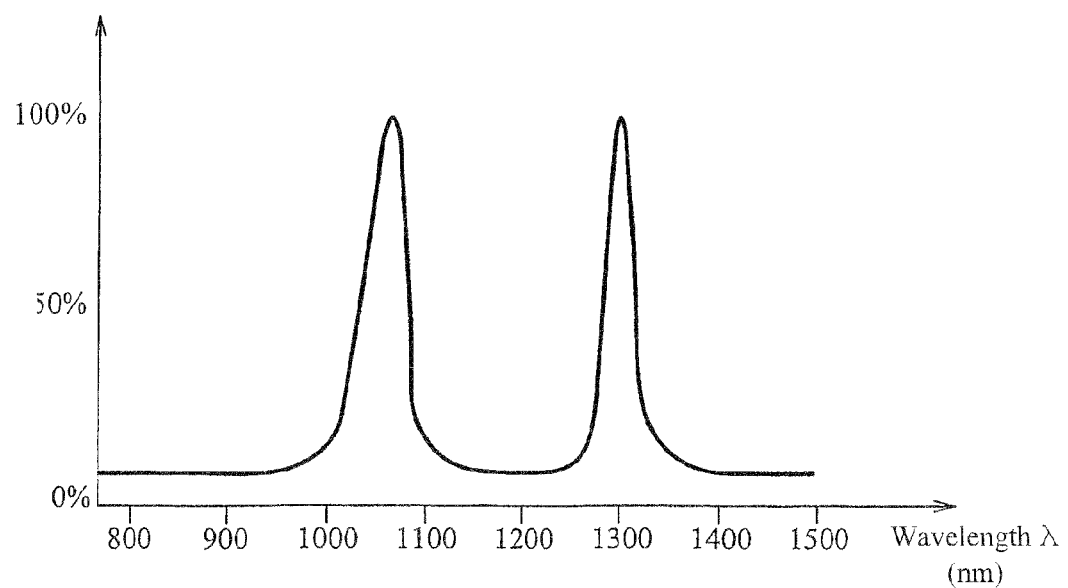
FIG. 2 is a graph illustrating the reflection characteristic of the semi-transparent mirror arranged facing the means of observation by light emission, as a function of wavelength.

In this embodiment, the mirror M1 is a dichroic mirror for which the light reflection characteristic as a function of the frequency spectrum of the incident beam is illustrated in FIG. 2. This drawing shows the percentage of light reflected as a function of the wavelength of the beam.

This mirror exhibits two reflection peaks corresponding to the two wavelengths of the laser sources 26 used. Thus, one is centred on the wavelength of 1064 nm while the second peak is centred on the wavelength of 1340 nm.

The device of FIG. 1 is used, for example, in the following way.

During an initial step, a map of the circuit is produced from the detection diode 28. To this end, a laser beam is emitted by the source 26 at a low power level of the order of 100 mW. This beam is moved on the surface of the circuit 14 by the displacement unit 30 in order to scan the circuit fully. The beam reflected by each point of the circuit 14 is transmitted up to the detection diode 28 via successive reflections at the mirrors M1, M2 and M3. The mirror M1 is reflecting, given the particular wavelength of the laser, and the mirror M3 is also reflecting due to its polarization.

For each position of the circuit, a measurement is performed by the detection diode 28. As is known per se, a map of the circuit is obtained based on measurements performed by the diode 28 for each point of impact of the laser on the circuit.

During a second step, the effect of the application of a high-power laser beam on a particular point of the circuit 14 is determined based on an acquisition of an image of the circuit in the light emission condition.

To this end, a high-power laser beam from the source 26 is focused, after reflection at the mirrors M2 and M1, by the displacement means 30 onto a determined point on the circuit. The laser is adjusted to a higher power level, for example equal to 300 mW.

According to a first embodiment, the circuit 14 is subjected to a test sequence. An image of the circuit in the light emission condition is acquired by the analysis device 22. The light emitted by the circuit resulting simultaneously from the applied test sequence and from the excitation by the laser beam is transmitted through the lens 18 up to the mirror M1, which is transparent for all wavelengths except that immediately neighbouring the wavelength of the laser. Thus, all the wavelengths except that of the laser are transmitted to the light-emission analysis device 22. The laser beam is however reflected at the mirrors M1 and M2 and is therefore not transmitted to the light emission analysis device 22, thus avoiding distortion of the measurements taken by this device, by the detector becoming dazzled, due to the power of the laser.

The image obtained corresponds to the average image of the circuit over the duration of the test sequence when a CCD sensor matrix is used.

The image thus obtained can be used to determine the state of operation of the circuit.

As a variant, and advantageously, a second image of the circuit subjected to the same test sequence is acquired while the laser beam is no longer applied to the circuit. A difference of the two images thus acquired is calculated. This differential image provides for highlighting only the currents resulting from the laser beam applied to the circuit. This image enables possible malfunctions in the circuit to be discovered.

In the case of the variant of the device in which the CCD sensor is replaced by a PICA sensor, the images obtained during the test sequence are a cluster of images each corresponding to one instant of the test and not an average image. As previously, a differential cluster of images is produced by the difference between the cluster of images acquired while the circuit is subjected locally to the laser beam and an image cluster in the absence of a laser beam.

According to another variant, no test sequence is applied to the circuit and the latter is merely polarized. The same steps as previously are then implemented.

Figure 3:
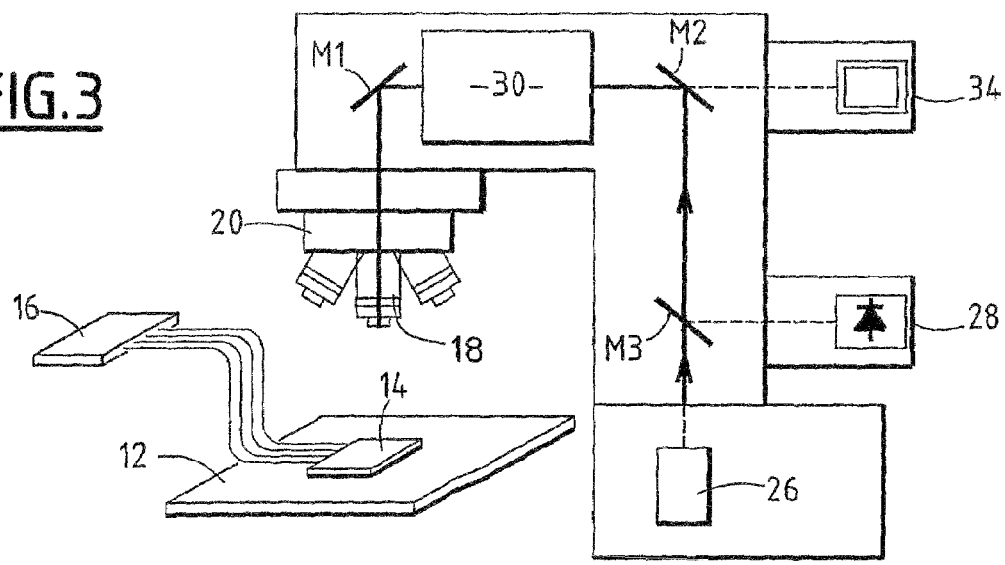
FIG. 3 is a view identical to that of FIG. 1 of another embodiment according to the invention.

FIG. 3 shows another embodiment of a device according to the invention.

In this embodiment, items that are identical to or that correspond to those of the previous embodiment are denoted by the same reference numbers.

In this embodiment, the mirror M1 is a totally-reflecting mirror and the light emission analysis device 22 is removed. On the other hand, the mirror M2 exhibits the reflection characteristics illustrated in FIG. 2. Behind this mirror, in the path of the light emitted by the circuit and reflected by the mirror M1, there is arranged a time-resolved emission single-point detector 34.

Such a senor provides for determining over time the change in the light emitted by a point on the circuit.

When the circuit is being analyzed, the laser beam emitted by the source 26 is focused at a point on the circuit 14, preferably different from the observation point and a test sequence is applied to the circuit. The graph obtained by the detector 34 and representing the current over time at the observation point provides for determining possible malfunctions in the circuit.

Figure 4:
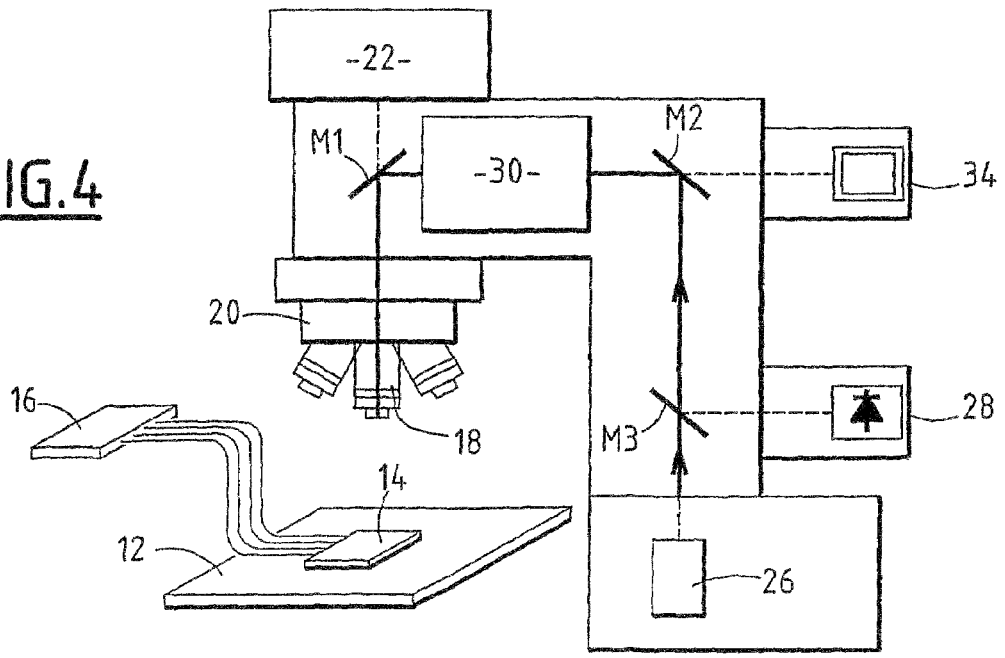
FIG. 4 is a view identical to those of FIGS. 1 and 3 of yet another embodiment according to the invention.

In the embodiment of FIG. 4, the device simultaneously includes the light emission analysis device 22 arranged behind the mirror M1 and the time-resolved emission single-point detector 34 arranged behind the mirror M2.

In this embodiment, the wavelength of the laser produced by the source 26 is preferably equal to 1340 nm.

Figure 5:
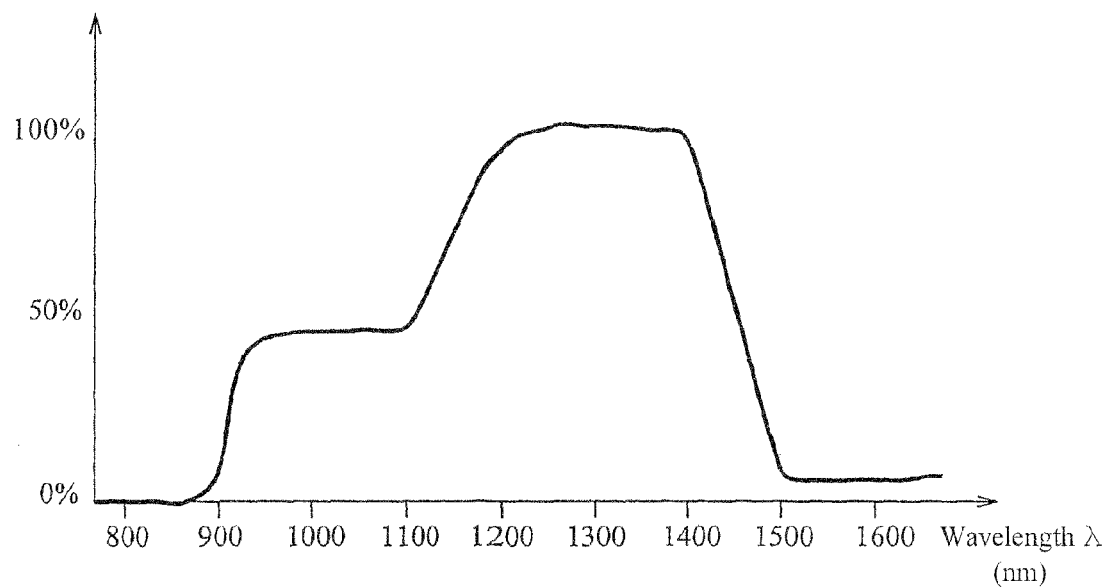
FIG. 5 is a view identical to that of FIG. 2 of the semi-transparent mirror of the embodiment of FIG. 4 placed facing the means of observation by light emission.

In a first embodiment and as illustrated in FIG. 5, the mirror M1 is formed by a semi-reflecting mirror ensuring total transmission and zero reflection for wavelengths of less than 900 nm. For wavelengths between 900 and 1100 nm, 50% of the incident light is transmitted and 50% of the incident light is reflected. For wavelengths greater than 1100 nm, the light is totally reflected.

Figure 6:
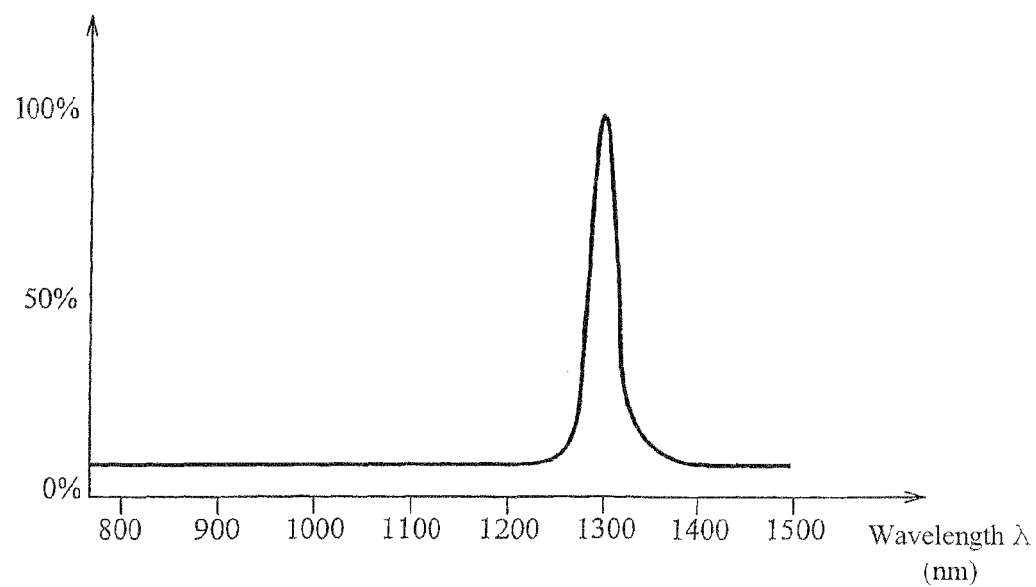
FIG. 6 is a graph identical to that of FIG. 2 for the semi-transparent mirror placed facing the time-resolved emission single-point detector.

The mirror M2 exhibits reflection characteristics as illustrated in FIG. 6. In particular, this mirror transmits all wavelengths except the wavelength of the laser, i.e. the wavelength of 1340 nm which is 100% reflected.

In this embodiment, during the second step of observation, the incident laser beam is focused at high power on a point of the circuit and the circuit is subjected to a test sequence. Given the reflection characteristics of the mirrors M1 and M2, the laser beam is totally reflected towards the circuit. The reflected beam from the circuit is itself also totally reflected by the mirrors M1 and M2, which are reflecting for the wavelength of the laser beam.

However, for the other wavelengths emitted by the circuit, arising from the flow of electric current, due either to the applied test sequence, or to the effect of the laser beam, the light is transmitted partly through the mirror M1 towards the device 22 and is partly reflected. The light reflected by the mirror M1 is totally transmitted through the mirror M2 up to the detector 34.

Thus, the light emitted by the circuit outside the wavelength of the laser is transmitted half to the device 22 and half to the detector 34.

Thus, simultaneously, a first image is acquired from the device 22 and a second measurement is made for a given point of the circuit by the detector 34.

According to yet another variant, the laser source 26 is replaced by a dual source formed by a source of white or infrared light and by a laser source.

The transmission of the light emitted by the circuit and of the incident laser beam through the same observation lens 18 and more generally through the same optical system provides for an excitation of the circuit at the very core of the circuit while it is operating, and this provides for benefiting simultaneously from an observation of the circuit while it is subjected to laser radiation at certain very specific points thus modifying its conditions of operation.

The invention claimed is:

1. A device for analyzing a circuit including:
   observation means for observing a light emitted by at least one localised observation area on the circuit due to the flow of electric current in this area, the observation means for observing the emitted light including a lens through which the emitted light is transmitted,
   means for exciting the circuit,
   wherein the means for exciting the circuit include a laser source and means for applying an incident laser beam generated by the source, through the same lens through which the emitted light is transmitted, on an excitation area of the circuit at the same time as the circuit is observed by the observation means,
   and wherein the device includes means for protecting the observation means from the incident laser beam and a reflected laser beam from the circuit.

2. The device according to claim 1, wherein the observation means and the laser beam application means include means for guiding the light emitted by the circuit and the emitted laser beam and the reflected laser beam along the same optical path in proximity to the circuit.

3. The device according to claim 2, wherein the means for guiding the light include at least one semi-reflecting mirror (M1, M2) arranged between the circuit and the observation means in a transmission path and between the laser source and the circuit in a reflection path, the semi-reflecting mirror (M1, M2) being at least partly transparent to the wavelengths emitted by the circuit and reflecting for the wavelength of the laser beam emitted by the laser source.

4. The device according to claim 3, wherein the means of observation of the emitted light include at least a first and a second sensor, arranged behind the a first and a second semi-reflecting mirror (M1, M2) respectively, and successively in that order from the circuit to the laser source in the path of the reflected laser beam, the first and second semi-reflecting mirrors (M1, M2) being at least partly transparent to the wavelengths emitted by the circuit and reflecting for the wavelength of the laser beam emitted by the laser source, the first semi-reflecting mirror (M1) being only partly transparent to the observation wavelengths of the second sensor.

5. The device according to claim 1 wherein the observation means include a sensor matrix.

6. The device according to claim 5, wherein the sensors are chosen from the group consisting of visible or infrared imaging charge-coupled devices (CCDs), gallium arsenide (InGaAs) sensors or Mercury Cadmium Telluride (MCT) sensors.

7. The device according to claim 5, wherein the sensors are three-dimensional light emission sensors of the Picosecond Imaging Circuit Analysis (PICA) type.

8. The device according to claim 1 wherein the observation means include a time-resolved emission single-point sensor.

9. The device according to claim 1 wherein the device further includes a diode for intercepting the reflected laser beam and measuring the intensity of the reflected laser beam.

* * * * *